United States Patent
Rawlinson et al.

(10) Patent No.: US 8,574,932 B2
(45) Date of Patent: Nov. 5, 2013

(54) PCB-MOUNTED INTEGRATED CIRCUITS

(75) Inventors: Paul Rawlinson, Rotherham (GB); David Hall, Winkleigh (GB)

(73) Assignee: Twenty Twenty Vision Limited, Blandford Forum, Dorset (GB)

(*) Notice: Subject to any disclaimer, the term of this patent is extended or adjusted under 35 U.S.C. 154(b) by 0 days.

(21) Appl. No.: 13/258,973

(22) PCT Filed: Mar. 23, 2010

(86) PCT No.: PCT/EP2010/053747
§ 371 (c)(1),
(2), (4) Date: Sep. 22, 2011

(87) PCT Pub. No.: WO2010/108905
PCT Pub. Date: Sep. 30, 2010

(65) Prior Publication Data
US 2012/0015457 A1      Jan. 19, 2012

(30) Foreign Application Priority Data

Mar. 24, 2009   (GB) .................................. 0905006.3

(51) Int. Cl.
*H01L 21/66*   (2006.01)
(52) U.S. Cl.
USPC ............................................. 438/15; 438/14
(58) Field of Classification Search
USPC ...................................................... 438/14, 15
See application file for complete search history.

(56) References Cited

U.S. PATENT DOCUMENTS

| | | | |
|---|---|---|---|
| 5,166,753 A | * | 11/1992 | Tokura .......................... 356/394 |
| 5,200,799 A | | 4/1993 | Maruyama et al. |
| 5,245,421 A | * | 9/1993 | Robertson et al. ............ 348/126 |
| 5,298,977 A | | 3/1994 | Shintani et al. |
| 5,568,264 A | * | 10/1996 | Nakatsuka et al. ........... 356/394 |
| 5,760,893 A | | 6/1998 | Raymond |

FOREIGN PATENT DOCUMENTS

| | | |
|---|---|---|
| JP | 61135476 | 6/1986 |
| JP | 8124985 | 5/1996 |
| JP | 10051134 | 2/1998 |
| JP | 10253323 | 9/1998 |
| JP | 2003214830 | 7/2003 |
| JP | 2006196819 | 7/2006 |

OTHER PUBLICATIONS

International Search Report for PCT/EP2010/053747 dated Jul. 5, 2010, 3 pages.
Written Opinion for PCT/EP2010/053747 dated Jul. 5, 2010, 7 pages.
UK Search Report for GB1004785.0, May 28, 2010, 2 pages.

* cited by examiner

*Primary Examiner* — Luan C Thai
(74) *Attorney, Agent, or Firm* — Reising Ethington P.C.

(57) ABSTRACT

A method and apparatus (20) for testing the mounting of an integrated circuit (16) on a printed circuit board (12) using a ball grid array comprises measuring the change in height, or drop, of the integrated circuit (16) relative to the printed circuit board (12) following soldering of the ball grid array and comparing the measured drop with a predetermined range. The integrated circuit is deemed to have been successfully mounted to the printed circuit board if the change in height falls within the predetermined range.

13 Claims, 2 Drawing Sheets

PCB-MOUNTED INTEGRATED CIRCUITS

INTRODUCTION

The present invention is concerned generally with improvements in or relating to printed circuit board (PCB)-mounted integrated circuits (ICs) and particularly, but not exclusively, to a method and apparatus for testing the mounting of an IC to a PCB. Aspects of the invention relate to a method and to an apparatus.

BACKGROUND TO THE INVENTION

There are several techniques employed for surface-mounting integrated circuits (ICs) onto printed circuit boards (PCBs). One common technique is the use of Ball Grid Arrays (BGAs) in which the pins of the IC are replaced by solder balls disposed on the underside of the IC package with the PCB carrying conductive pads in a pattern corresponding to the solder balls. In a technically-equivalent variation of this technique, the solder balls are formed instead on the PCB itself in a pattern that matches the pins of the IC.

Mounting the IC package to the PCB involves placing the IC in the correct position on the PCB and then heating the assembly, for example by means of an oven or infrared heater, causing the solder balls to melt in a process called "reflow". During reflow, the IC sinks towards the PCB under gravity with the molten solder holding the package in alignment with the circuit board at the desired separation distance through surface tension. The solder then cools and solidifies to form the desired electrical contacts.

IC packages using a similar solder-ball technology are known as "flip-chips", wherein the solder balls are deposited onto the top-side of the chip or wafer which is then flipped over and aligned with the matching pads on the PCB. The connections are again created by heating and melting the solder during the reflow process.

BGA packages have a number of advantages over conventional pin grid array (PGA) techniques and, as a result, are becoming widely used globally, particularly for larger PCBs with many connections since they allow for higher density components.

For example, BGA IC packages are easier to align to the PCB than using conventional metal connectors and relieve the problems associated with ICs having large numbers of pins with correspondingly decreased pin-to-pin spacing. In particular, as the distance between adjacent pins decreases, the incidence of pin shorting increases. BGAs generally do not have this problem when the solder is factory-applied to the package.

In addition, since the BGA connectors are located on the underside of IC, this has facilitated the provision of chip scale packaging (CSP) wherein the overall size of the IC package can be reduced to around 1.2× the size of the semiconductor die itself.

Furthermore, in comparison with IC packages having discrete leads, BGA's exhibit a lower thermal resistance between the package and the PCB, permitting heat generated by the circuit inside the package to flow more easily to the PCB, thereby reducing the occurrence of overheating.

Finally, with their very short distance between the package and the PCB, BGAs have lower inductance than IC packages having discrete leads. This reduces unwanted distortion of signals in high-speed electronic circuits and therefore provide superior electrical performance to conventional devices.

On the other hand, as with many electronic systems, the soldering process is not wholly reliable and open contacts or short circuits maybe formed inadvertently. In particular, since the solder balls are substantially non-compliant (that is, unable to flex), thermal or mechanical stresses caused, for example, by differences in coefficients of thermal expansion between the PCB substrate and the BGA package or by flexing and vibration of the PCB, may cause the solder joints to fracture.

It is therefore conventional to perform some form of testing of the IC connections on the PCB after soldering. In order to maintain production efficiency, an automated testing process is generally preferred. The automated inspection of electronic components is an integral part of electronic assembly manufacture to prevent and detect faults and to ensure quality and performance of the assembled systems. Increases in PCB complexity and the desire to improve yields has required the development of real-time automated inspection.

A problem with the use of BGAs, however, is that, because the connections are located on the underside of the IC, inspection of the soldered joints is very difficult. This may lead to faults not being diagnosed using standard automated inspection techniques, resulting in faulty products and a loss of revenue for manufacturers.

A variety of techniques have been proposed for testing the mounting of BGAs on PCBs. These techniques generally fall into two categories: physical inspection of the soldered connections; and electronic testing of the PCB circuit. Frequently, both physical and electronic tests are carried out in succession.

For example, visual inspection of the connections can be performed using Automated Optical Inspection (AOI) in which a video camera is used to scan the assembly and compare the scanned image with pre-recorded images of properly soldered PCBs in order to determine the efficacy of the soldered joints. However, due to the location of the solder connections, AOI systems are usually not able to measure the integrity of the solder joints and are generally limited to diagnosing missing components and placement errors.

An alternative technique is known as Automated X-ray Inspection (AXI) which is generally similar to AOI but employs an X-ray source instead of visible light. The penetrative nature of X-rays allows AXI devices to inspect features which are hidden from view, such as the solder connections beneath a BGA package, and to identify faults such as open circuits, short circuits, insufficient solder, missing parts and misaligned components.

In Circuit Testing (ICT) is also a method available for testing of electronic PCBs using an electrical probe that can check for shorts, opens, resistance, capacitance and other parameters to show if the PCB has been fabricated correctly. Typically ICT uses a "bed of nails" test feature or fixtureless in-circuit testing. ICT is typically used in conjunction with AOI or AXI.

Limitations of the above-mentioned automated inspection techniques for BGA assemblies can be summarised as follows:

1. The cost of AOI, AXI and combined AOI/AXI systems is prohibitively expensive for many production lines;
2. The connections between the IC and the PCB are located on the underside of the IC and thus hidden from optical inspection, making it difficult to inspect the quality of the solder joints;
3. AOI does not allow for the identification of open-circuits or short circuits;
4. Warping of ICs (which commonly occurs due to heating) is difficult to correct for using AOI and/or AXI;
5. AXI is relatively slow compared to line-speeds;

6. Using ICT, the quality of electrical contacts cannot be tested;
7. Achieving 100% ICT access cannot be cost-effectively achieved for BGAs due to the increased node count associated with BGA technology.

It is against this background that the present invention has been conceived. The present invention aims to address one or more of the above problems and to improve upon known techniques for testing the mounting of ICs to PCBs. Embodiments of the invention may provide a method and/or apparatus that enables the integrity of the soldered joints to be determined quickly, accurately and cost-effectively in an automated process. Other aims and advantages of the invention will become apparent from the following description, claims and drawings.

SUMMARY OF THE INVENTION

Aspects of the invention therefore provide an apparatus and a method as claimed in the appended claims.

According to another aspect of the invention for which protection is sought, there is provided a method of testing the mounting of an IC on a PCB, comprising comparing the position of the IC relative to a reference position and determining the efficacy of the mounting in dependence on the comparison.

The present applicants have discovered that a correctly soldered IC will sink or drop towards the surface of the PCB during reflow by a substantially fixed amount. Thus, by simply measuring the position of the IC on the PCB and comparing it with a known reference position, it can be easily determined whether the solder connection is good.

In an embodiment, the method comprises measuring a first position of the IC relative to the PCB before carrying out a soldering process to electrically connect the IC to the PCB, measuring a second position of the IC relative to the PCB after the soldering process and comparing the first and second positions.

In this embodiment, therefore, the reference position comprises the first position, that is to say the position of the IC relative to the PCB prior to the soldering process. By comparing the position of the IC relative to the PCB after completion of the soldering process with the reference position, the drop amount, i.e. the amount by which the IC has sunk towards the surface of the PCB, can be established. By measuring the first and second positions of the IC relative to the PCB, any positional variations due to PCB warping or component thickness are advantageously eliminated.

In an embodiment, measuring the first position comprises measuring the height of the IC above the surface of the PCB before the soldering process and measuring the second position comprises measuring the height of the IC above the surface of the PCB after the soldering process. The two measured heights may then be used to calculate the change in height of the IC relative to the PCB due to the soldering process.

In an embodiment, the method comprises comparing the change in height with a predetermined value or range and, if the change in height falls outside the predetermined value or range, determining that the IC has not been successfully mounted to the PCB.

The predetermined value may be approximately 180 μm. The predetermined range may be between approximately 150 μm and approximately 210 μm, more preferably between approximately 160 μm and approximately 200 μm.

The method may comprise comparing the change in height of a plurality of points on the IC relative to the PCB and determining that the IC has not been successfully mounted to the PCB if the change in height of each of the plurality of points on the IC is not substantially the same.

The plurality of points may include locations at or adjacent the corners of the IC and/or points along one or more edges of the IC, for example the mid points of the edges. In an advantageous embodiment, the height of the IC is measured at each corner and at the midpoint of the edge between each corner for a total of eight measurements.

The height of the or each point above the surface of the PCB may be achieved by measuring the distance of the or each point from a known position, such as a reference point of a measuring device, measuring the distance from the known position of a point on the PCB adjacent to the corresponding point on the IC, and determining the difference between the measured distances.

According to another aspect of the invention for which protection is sought, there is provided a method comprising melting a plurality of solder balls disposed between a substrate and an electronic component so as to solder the component to the substrate, measuring a change in height of at least one point on the component above the surface of the substrate following the soldering process and determining that the component is not correctly soldered to the substrate if the measured change in height falls outside of a predetermined range.

According to another aspect of the invention for which protection is sought, there is provided an apparatus for testing the mounting of an electronic component, such as an IC, on a substrate, such as a PCB, comprising a measurement device configured to measure a change in height of the component above the substrate following a soldering process and a processor configured to compare the measured change in height with a predetermined value or range and to determine whether the component has been successfully mounted to the substrate in dependence on the comparison.

Within the scope of this application it is envisaged that each of the various aspects, embodiments, examples, features and alternatives set out in the preceding paragraphs, in the claims and/or in the following description and drawings may be taken independently or in any combination thereof. In particular, features described in connection with one embodiment are applicable to other embodiments, except where there is an incompatibility of features.

DETAILED DESCRIPTION OF AN EMBODIMENT OF THE INVENTION

The present invention will now be described, by way of example only, with reference to the accompanying drawings in which.

Figure 1:
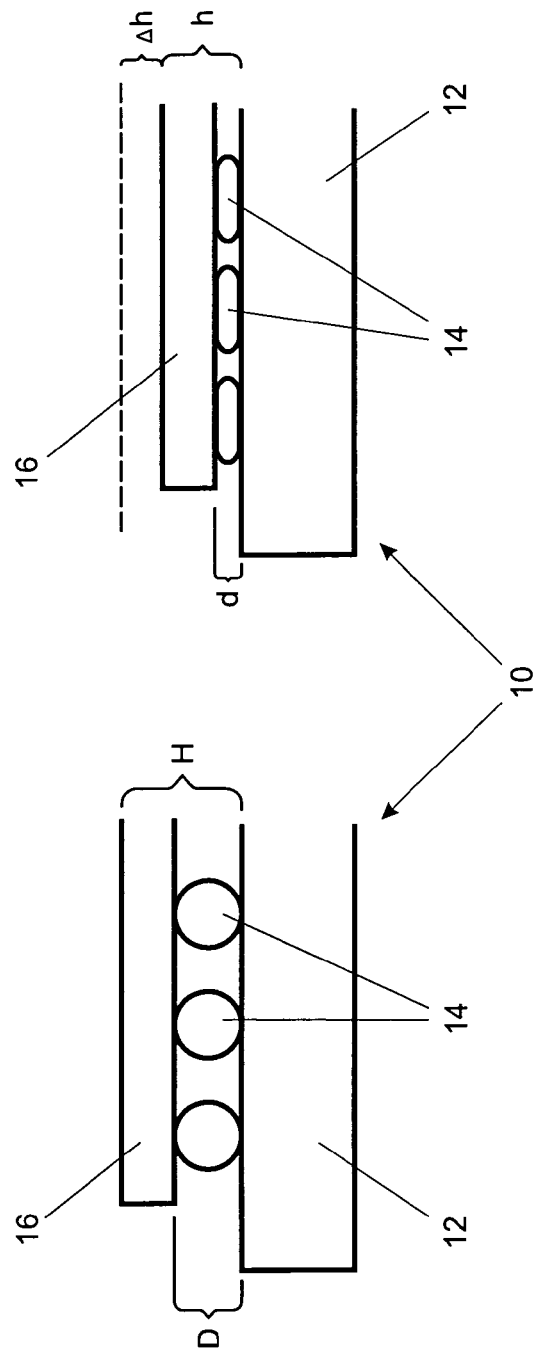
FIGS. 1A and 1B illustrate schematically sections through a solder joint between an IC and a PCB before and after soldering, respectively.

Referring to FIG. 1A, which is schematic and not shown to scale, a portion of a BGA assembly prior to soldering is shown in cross section generally at 10. The BGA assembly 10 may comprise a part of an electronic circuit for incorporation within an electrical device. The BGA assembly 10 comprises a PCB 12 having three solder balls 14 formed on its upper surface. An IC package 16, to be mounted on, and electrically connected to, the PCB 12, is seated on the solder balls 14. It can be seen that, prior to soldering, the solder balls 14 are generally uniform in shape such that the IC 16 is spaced from the PCB 12 by a first distance D.

In the illustrated embodiment, the solder balls 14, constituting part of the BGA, are formed on the upper surface of the PCB 12 and the IC package 16 is positioned such that the solder balls 14 are coincident with corresponding conductive pads on the underside thereof. In other embodiments (not shown), the solder balls 14 may instead be formed on the underside of the IC package 16 which is placed onto the PCB 12 such that the solder balls 14 are coincident with corresponding solder pads formed on the upper surface thereof.

It will be appreciated that, in practice, the BGA 10 may comprise many, perhaps even hundreds, of solder balls 14, depending on the application. For clarity, however, only three solder balls 14 are shown and described here.

During soldering, the assembly is heated such that the solder balls 14 melt in a process called reflow so as to electrically connect the IC 16 to the PCB 12. Reflow of the solder balls 14 causes them to deform, spreading out over the corresponding contact regions (conductive pads) of the IC 16. As shown in FIG. 1B, melting of the solder balls 14 causes the IC 16 to sink under its own weight towards the upper surface of the PCB 12 such that, after soldering, the IC 16 is spaced from the PCB 12 by a second, reduced distance d.

As with any soldering process, there is the possibility of poor or faulty connections being formed between the IC 16 and the PCB 12. Since a single faulty contact, for example an open or a short, can affect the function of the entire electronic circuit, it is conventional to test or inspect the mounting of the IC 16 on the PCB after soldering. The demands of production efficiency require such testing to be automated and both fast and reliable.

As described above, the present applicants have identified a need to improve the performance of currently available automatic inspection systems. Automated Optical Inspection (AOI), although sufficient for inspection of visible components, is inadequate for inspection of BGAs, Flip-chips and other components where the solder joints are under the component and therefore hidden from view. Automated X-Ray Inspection (AXI), on the other hand, is not only excessively expensive but has also shown itself to be an incomplete solution for the inspection of these types of system, being limited in the detection of a range of important faults such as open connections, short-circuits and board warping.

Furthermore, the use of ICT immediately after assembly is time consuming and is generally unable to determine the quality of the electrical connection. For example, ICT may show an erroneous result where a good electrical contact is achieved for cold solder joints (where there is electrical contact). This is typically observed as the BGA being slightly elevated at one corner, where the cold joints occur. Both AOI and AXI may indicate an acceptable joint. However, subsequent mechanical movement of the boards, such as vibration during transit, may cause the solder to crack and break these connections, resulting in board failure.

In addressing this issue, the present applicants have recognised the heretofore unappreciated fact that a high quality solder connection between the IC 16 and the PCB 12 will result in the IC 16 sinking towards the PCB 12 by a predetermined amount. That is to say, in the example of FIG. 1, for a correctly soldered joint, the distance Δd (D minus d) falls within a predetermined range.

The applicants have discovered, through considerable research and empirical testing, that a good component will consistently drop a substantially fixed distance each time a successful joint is made and that a typical value for the drop is approximately 180 μm (0.00018 m) with a variation of approximately 20 μm (0.00002 m). The applicants have found that the repeatability, consistency and reliability of these measurement values is surprisingly high. If the solder balls 14 do not make a good contact with the IC 16, resulting in a poor contact or dry joint, the drop of the IC 16 relative to the PCB 12 is significantly reduced.

The applicants have therefore recognised that the position of the IC 16 relative to the PCB 12 changes after soldering within a predetermined range for a good solder joint and that any change in position outside of this range indicates a poor or faulty joint. Thus, by simply comparing the position of the IC 16 after completion of the reflow process with a reference position, for example the position of the IC 16 before commencement of the reflow process, it can be determined with a high degree of accuracy and reliability whether the IC 16 has been successfully mounted to the PCB 12. The use of this method thus provides a rapid and accurate test of whether the soldering process has been effective.

Figure 2:
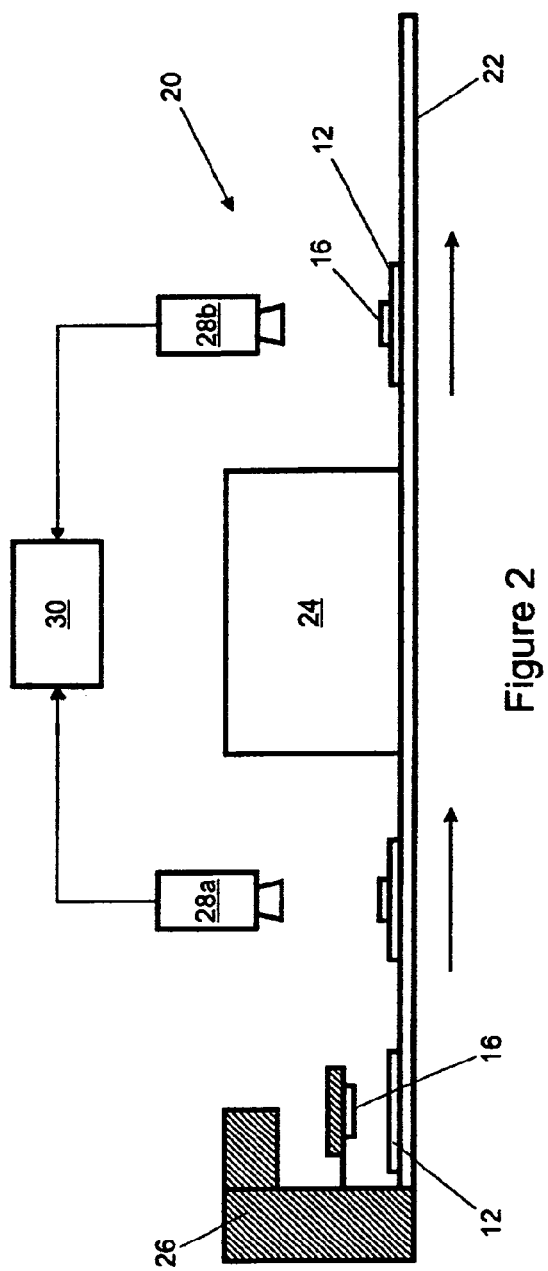
FIG. 2 illustrates schematically an apparatus embodying one form of the invention.

FIG. 2 illustrates, in schematic form, a part of an apparatus for manufacturing and testing the quality of the IC mounting to the PCB 12. The apparatus, shown generally at 20, comprises transport means, in the form of a conveyor system or similar transport device 22, arranged to convey BGA assemblies, consisting of PCBs 12 carrying one or more ICs 16 thereon, through a reflow soldering unit 24.

Figure 3:
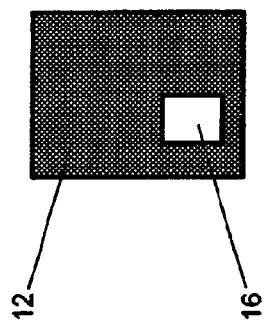
FIG. 3 is a plan schematic view of a PCB having an IC mounted thereon by means of a ball grid array.

The apparatus comprises a placement unit 26 arranged to place each IC 16 in its correct position on the PCB 12 for mounting thereto. FIG. 3 illustrates, in plan view, a PCB 12 having an IC package 16 placed on it by means of the placement unit 16. As described above, the PCB 12 carries a solder ball array (BGA) comprising a plurality of solder balls 14 for electrically connecting the PCB 12 to the corresponding conductive pads on the underside of the IC package 16. The placement unit 26 is therefore required to position the IC package 16 on the solder ball array which cannot be seen in FIG. 3 since it lies beneath the IC package itself.

Mounting the IC 16 to the PCB 12 involves melting the solder balls 14 in the array to form the desired electrical connections therebetween and is achieved by means of the reflow soldering unit 24. The reflow soldering unit 24 may comprise a reflow oven or infrared heater arranged to apply thermal energy to the BGA assembly so as to cause melting, or reflow, of the solder balls 14.

In use, therefore, the PCB 12, with the IC 16 having been placed thereon by the placement unit 26, is transported through the reflow soldering unit 24 by the transport device 22. On leaving the reflow soldering unit 24, the PCB 12 with the IC 16 soldered thereto is transported to other parts of the manufacturing process for further assembly. This form of manufacturing apparatus will be well understood by the skilled person and further detail is not provided herein.

In order to test the mounting of the IC 16 to the PCB 12, for example to check the reliability and integrity of the solder joints between the IC 16 and the PCB 12, the apparatus 10 comprises measurement means in the form of a pair of laser measurement devices 28a, 28b for measuring or detecting the position of the IC 16 relative to the PCB 12. The laser measurement devices 28a, 28b are each connected to control means, in the form of a processor 30, for receiving and processing measurement signals generated by the laser measurement devices 28a, 28b.

In use, the first laser measurement device 28a is arranged to measure the height H of the IC 16 above the surface of the PCB 12 before passing through the reflow soldering unit 24. This is achieved by measuring the distance firstly between the measurement device and a point on the upper surface of the IC 16 and secondly between the measurement device and an adjacent portion of the PCB 12. The difference between these two measurements represents the vertical position or height H of the IC 16 relative to the surface of the PCB 12.

Similarly, the second laser measurement device 28b is arranged to measure the height h of the IC 16 above the surface of the PCB 12 after leaving the reflow soldering unit 24. Again, the height h of the IC 16 above the surface of the PCB is determined by measuring the difference between the vertical position of the IC 16 and the vertical position of the adjacent portion of the PCB 12.

The manner in which the laser measurement devices carries out such measurements will be well understood by the skilled person and further detail is considered irrelevant to the invention and thus unnecessary.

The pre- and post-soldering height measurements H, h are input to the processor 30 which calculates the difference ($\Delta h$) therebetween, representing the amount by which the IC 16 has dropped or sunk towards the PCB 12 due to the reflow process. The processor 30 then checks to determine whether the calculated drop amount ($\Delta h$) falls within a predetermined range indicative of a good solder connection in order to provide a Pass/Fail result.

For example, if the IC 16 is determined to have dropped by an amount within the predetermined range, the mounting of the IC 16 to the PCB 12 is deemed to have been successful and the processor outputs a Pass result. On the other hand, if the IC 16 has dropped by an amount which falls outside the predetermined range, the mounting of the IC 16 to the PCB 12 is deemed to have been unsuccessful and the processor 30 outputs a Fail result. In this case, the PCB 12 may be returned into the solder reflow unit 24 for resoldering, removed for further processing or testing, or rejected.

The present invention relies on the previously unrecognised fact that once the BGA assembly is heated in the reflow process it will sink under its own weight into the solder to make a good connection. Furthermore, as the solder cools and solidifies, it contracts causing the IC 16 to be pulled further towards the surface of the PCB 12. As described above, the applicants have recognised that an IC package 16 will drop a substantially fixed distance when all the joints are successfully made and that, for good quality connections to be achieved, each joint should drop by approximately the same amount.

The applicants have further determined that the optimum drop amount ($\Delta h$) is approximately 180 µm (0.00018 m)±20 µm (0.00002 m), hereafter termed Range A. If this consistent drop within Range A is not achieved during the reflow process, it suggests that the soldered connections are not of an acceptable quality. In one embodiment, therefore, the following criteria may be used to evaluate the results of the measurement process:

a) If the height drop ($\Delta h$) of the IC relative to the PCB is less than Range A, then this indicates the presence of one or more open contacts;
b) If the height drop ($\Delta h$) of the IC relative to the PCB is more than Range A, then this indicates the presence of short circuits;
c) If height drop ($\Delta h$) is not consistent across the IC package 16, then the package is tilted or inclined relative to the PCB 12 which may be indicative of a combination of one or more open contacts and one or more shorts.

It will be understood that each height measurement may consist of two discrete measurements: the first at a point on the IC 16 itself and the second at an adjacent point on the PCB 12 surface. The difference between these two measurements represents the relative distance (i.e. the height H, h) between the PCB 12 and the upper surface of the IC package 16. The use of this relative distance, as opposed to simply measuring the height of the IC 16 above the transport device 22, is advantageous since it eliminates the effect of PCB warping and automatically allows for different component types and differences in component thickness, resulting in a more accurate analysis of the BGA assembly 10.

The number of solder balls 14 in the BGA 10 is frequently large and, under normal circumstances, the number of poor or faulty solder joints will be very small. Thus, since even a single bad connection will normally cause the drop distance of the IC 16 to fall outside of Range A, measurement of the pre- and post-soldering heights H, h of only a single point on the IC 16 may be sufficient to determine most occurrences of poor joints. However, measurement of the height H, h of multiple points on the IC 16 increases the accuracy and reliability of the testing process and enables the detection of substantially all instances of poor or faulty joints irrespective of their position or distribution within the BGA.

Advantageously, therefore, the laser measurement devices 28a, 28b may arranged to measure the height H, h of the IC 16 above the surface of the PCB 12 at a plurality of positions. In the illustrated embodiment, for example, the laser measurement devices 28a, 28b are arranged to measure the height of eight points on the IC 16: Four points located at or adjacent the corners of the IC package 16 and four points are located substantially at the midpoints of the edges extending between the corners. Again, each of the height measurements is made by determining the difference between the height of the respective point on the IC 16 being measured and the height of the adjacent point on the PCB 12.

The use of this number and distribution of measurement points enables the detection of substantially all opens, shorts and IC package tilting and is thus considered to provide the optimal compromise between accuracy, reliability and process efficiency.

The present invention provides a simple yet rapid and highly effective method and apparatus for determining the efficacy of PCB-mounted ICs and the soldered connections therebetween. By employing accurate, simple and reliable height measurements of the component (for example a BGA assembly) above the surface of the PCB at multiple points on the surface of the component (for example at the corners and/or at the midpoints of the sides), the method and apparatus of the invention can measure two primary characteristics of the component being soldered: a drop distance ($\Delta h$) of approximately 180 µm±20 µm, and; a substantially consistent drop across the component (i.e. no tilting); in order to achieve accurate and reliable testing of the component mounting.

In tests, the method and apparatus of the present invention has been proven to detect many faults which would have been or were missed by AOI and AXI and may not have been detected even by post-soldering ICT. One fault which occurred relatively often and was not detected even at ICT was the occurrence of a BGA with a lifted end in which there was initial electrical contact but which would be likely to fail within a short period of time.

The present invention thus provides numerous advantages over existing automated inspection technologies, such as:
1. The testing can be conducted at line speed;
2. The results are not adversely affected by PCB warping.
3. The method and apparatus can detects faults not detected by X-Ray, ICT and functional test such as open contacts and short circuits;
4. Live Statistical Process Control (SPC) results can be provided giving process trends and detection of problems at the earliest possible stage;

5. The method and apparatus is relatively simple to implement and control;
6. The cost of the apparatus is significantly lower than conventional systems.

While the above described embodiment represents an advantageous form of the invention, it is nevertheless envisaged that various modifications may be made to the method and apparatus described above without departing from the scope of the invention as defined in the appended claims.

For example, the pre- and post-soldering measurements could be carried out by a single measurement device 28, with the transport device 22 being arranged to carry the PCB 12 and its IC 16 beneath the measurement device 28 both before and after passing through the reflow soldering unit 24. The illustrated embodiment having two separate measurement devices 28a, 28b is, however, considered to be preferable since it improves speed and efficiency of the soldering and testing process.

In addition, the form of measurement device used can be selected as desired. In the illustrated embodiment, laser measurement devices are employed which, as will be well understood by the skilled person, are arranged to direct a laser beam at the point on the IC 16 or PCB 12 being measured and determine the distance of that point from the laser emitter. In such cases, a spot laser may be used.

Alternatively, an integrated 3D scanning laser profiler technique may be used to determine the height, in which case the laser measuring device may scan across the surface of the component rather than measuring the one or more discrete points.

Nevertheless, any other convenient means for measuring the height of the IC 16 may be employed and, in this case, the method of testing remains the same with merely the method of data collection being different. It will be appreciated, however, that the selected measurement means must be capable of a measurement resolution of approximately 20 •m or less in order to implement the inventive method.

In the event that the PCB 12 carries more than one IC 16, the transport device 22 will halt the PCB 12 under each laser measurement device so that all of the mounted ICs 16 may be tested. The measurement devices 28a, 28b may therefore incorporate X-Y movement stages to enable scanning of all components on the PCB 12. In this instance it is advantageous if the first and second measurement devices 28a, 28b are spaced apart by a multiple of the spacing between adjacent PCBs 12 on the transport device 22 so that at each halting, measurements can be made simultaneously by both measurement devices.

A CCD camera may be employed to align the unit under test relative to the X-Y stage as the board position may vary for each unit. The CCD camera may also be used for limited AOI testing.

Each PCB may carry a barcode for reading by the CCD camera in order to correlate pre- and post-soldering measurements for a single PCB 12. The processor 30 may comprise a PC arranged to store the measurements for each unit under test against the corresponding barcode serial number.

Advantageously, even the initial measurement of each unit under test by the first measurement device 28a may be useful in determining the force used by the IC placement unit 26 to place the IC package 16 on the PCB 12 based on the extent to which the solder balls 14 in the BGA are compressed—too little compression may lead to open contacts while excessive compression may result in short circuits. The apparatus of the invention can be used to monitor the operation of the IC placement unit 26 and, if necessary, provide controlling feedback.

It may also be possible to monitor the size of the solder balls 14 in the BGA in order to detect trends towards the balls becoming too small or too big.

The processor 30 may also be arranged to run statistical process control (SPC) on the results, as well as interface to an in-house network. The results of all tests performed can be logged against board serial numbers to enable monitoring of the conformance of the production lines to various parameters or criteria required by specific customers or customer types.

The method of the invention may be used on-line or off-line as desired. Furthermore, the apparatus can be used to monitor the paste height if a laser scanning method is used. This may require a third position in the line controlled by the same processor 30.

While embodiments of the present invention have been described with reference to a conventional ball grid array, the invention is equally applicable to more advanced integrated circuit packaging techniques such as Package-on-Package (POP) technology in which two or more IC packages are vertically stacked and connected via ball grid arrays.

POP technology improves packaging density but is extremely difficult to inspect using even AXI techniques which are generally unable to distinguish between the stacked BGAs and therefore incapable of identifying soldering faults with acceptable accuracy. The present invention, on the other hand, advantageously permits identification of soldering faults even in POP PCBs with multiple-stacked BGAs.

This application claims priority from UK patent application no. GB0905006.3 filed 24 Mar. 2009, the entire contents of which are expressly incorporated herein by reference.

The invention claimed is:

1. A method of testing the mounting of an electronic component on a substrate, comprising:
   placing the electronic component on the substrate, at least one of the electronic component and the substrate including a ball-grid array (BGA);
   measuring a first height, relative to the substrate, of a plurality of points on the component;
   heating the BGA so as to cause reflow thereof such that the electronic component sinks towards the substrate under its own weight and/or is pulled towards the substrate by the solder of the BGA;
   measuring a second height, relative to the substrate, of each of the plurality of points on the component after reflow;
   comparing the first and second heights; and
   determining whether the component is correctly mounted on the substrate in dependence on the comparison.

2. A method as claimed in claim 1, wherein measuring the first and/or second heights of the component comprises:
   measuring a first distance from a measurement device to one of the plurality of points on the component;
   measuring a second distance from the measurement device to a location on the substrate close or adjacent to said one of the plurality of points; and
   calculating the difference between the first distance and the second distance.

3. A method as claimed in claim 1, comprising:
   determining that the component is correctly mounted on the substrate if the difference between the first height and the second height falls within a predetermined range; and/or
   determining that the component is not correctly mounted on the substrate if the difference between the height of the component before the soldering step and the height of the component after the soldering step falls outside a predetermined range.

4. A method as claimed in claim 3, wherein the predetermined range is between approximately 160 μm and 200 μm.

5. A method as claimed in claim 1 wherein the plurality of points includes two or more points at or adjacent to corners of the component and/or at or adjacent the midpoint of sides of the component.

6. A method as claimed in claim 1 wherein the plurality of points comprises at least eight points on the component.

7. A method as claimed in claim 1, comprising determining that the component is not correctly mounted on the substrate if the difference between the height of the component before the soldering process and the height after the soldering step is not substantially the same for each of the plurality of points.

8. A method as claimed in claim 1, wherein the substrate comprises a printed circuit board (PCB), and the component comprises an integrated circuit or IC package for mounting to the PCB by means of the BGA.

9. An apparatus adapted to perform a method as claimed in claim 1.

10. An apparatus for testing the mounting of an electronic component on a substrate, the apparatus comprising:
- a placement unit operable to place the electronic component on the substrate, at least one of the electronic component and the substrate including a ball-grid array (BGA);
- a heater operable to heat the BGA so as to cause reflow thereof such that the electronic component sinks towards the substrate under its own weight and/or is pulled towards the substrate by the solder of the BGA;
- at least one measurement device operable to perform a measurement of a first height, relative to the substrate, of a plurality of points on the component before reflow and to perform a measurement of a second height, relative to the substrate, of said plurality of points on the component after reflow; and
- a processor operable to calculate a change in height from said first and second measurements and to determine whether the component is correctly mounted on the substrate in dependence on the calculation.

11. An apparatus as claimed in claim 10, wherein the processor is configured to determine that the component is correctly mounted to the substrate if the measured change in height falls within the predetermined range and/or to determine that the component is not correctly mounted to the substrate if the measured change in height falls outside the predetermined range.

12. An apparatus as claimed in claim 10 wherein the predetermined range is between approximately 160 μm and approximately 200 μm.

13. An apparatus as claimed in claim 10, wherein the at least one measurement device comprises one or more laser measurement devices arranged to measure the height of the component relative to the substrate before and after soldering.

* * * * *